United States Patent
Chang

(10) Patent No.: US 7,356,656 B1
(45) Date of Patent: Apr. 8, 2008

(54) SKEW FREE CONTROL OF A MULTI-BLOCK SRAM

(75) Inventor: Meng-Fan Chang, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/571,373

(22) Filed: May 15, 2000

(51) Int. Cl.
*G06F 12/00* (2006.01)

(52) U.S. Cl. .................... 711/154; 711/104; 365/230.02

(58) Field of Classification Search ................ 711/154, 711/155, 167, 104; 365/230.03, 230.02, 365/233
See application file for complete search history.

(56) References Cited

U.S. PATENT DOCUMENTS

| | | | |
|---|---|---|---|
| 4,926,384 A | 5/1990 | Roy | |
| 5,243,703 A | 9/1993 | Farmwald et al. | 395/325 |
| 5,581,126 A | 12/1996 | Moench | 257/776 |
| 5,767,715 A * | 6/1998 | Marquis et al. | 326/93 |
| 5,771,199 A * | 6/1998 | Lee | 365/230.03 |
| 5,819,026 A * | 10/1998 | Lhotak et al. | 714/38 |
| 5,837,557 A | 11/1998 | Fulford, Jr. et al. | 438/6 |
| 5,850,509 A * | 12/1998 | Fandrich et al. | 711/100 |
| 6,009,501 A * | 12/1999 | Manning | 365/230.03 |

* cited by examiner

*Primary Examiner*—Pierre-Michel Bataille

(57) ABSTRACT

A multi-block SRAM memory system is described where a single global clock pulse is distributed to each memory block from the central control. At each SRAM memory block a local signal generator uses the globally distributed clock pulse to generate the required memory control pulse signals. By generating the memory control pulses locally, instead of distributing these from the central control the variations in skew are greatly reduced. Thus the required timing relationship between memory control signals can be achieved with smaller timing margins. This allows higher speed memory cycle and more reliable memory operation.

11 Claims, 5 Drawing Sheets

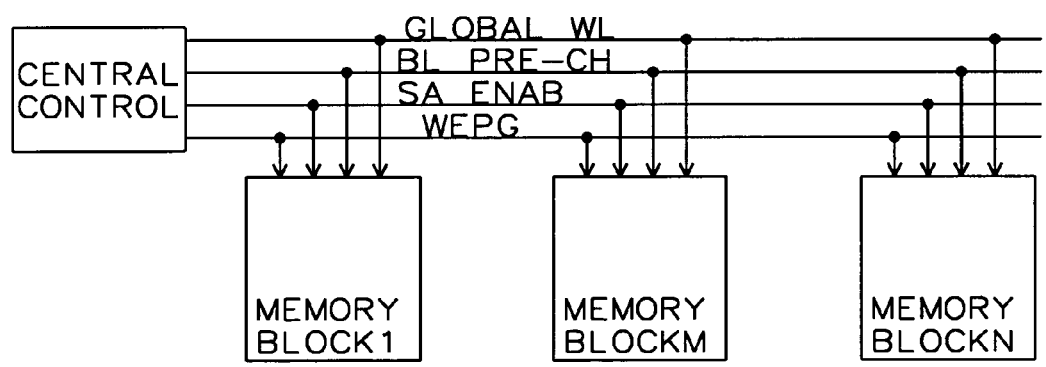
FIG. 1 – Prior Art

SKEW FREE CONTROL OF A MULTI-BLOCK SRAM

BACKGROUND OF THE INVENTION

1. Field of the Invention

This invention relates to the control of multi-block semiconductor SRAM, and more particularly to the generation of memory control pulses.

2. Description of the Related Art

Recent designs of Megabit semiconductor SRAM (static random access memory) are generally based on a multi-block architecture as shown in FIG. 1. The multi-block architecture design results in power saving and memory speed improvement. The central control generates global signals which are distributed to each memory block where they are used directly or are decoded to produce required local control signals. The larger the size of the SRAM, the longer the distribution paths for the global control signals. The global control pulse signals travel to each memory block and have different wire loading and fan-out loading causing a variation in delay at each memory block. Memory design requires a specific relationship between the leading and trailing edges of control pulse signals. The differences in loading and fan-out result in variation in skew of these control pulses. In high speed memories, these variations in loading and fan-out are significant and limit the speed of memory operation by requiring sufficient timing margins to accommodate worst case skews.

FIG. 2 and FIG. 3 illustrate the effect of skew on the timing relationship between memory control pulses for Read and Write operations respectively. The correct timing relationship between the memory control pulses exists at the output of the Central Control (FIG. 2A). These are globally distributed to each memory control block. These signal pulses have varied delays as they propagate through the system which affects the timing relationships between the pulses. In the extreme case, the resultant skew may be large enough to cause memory malfunction. This is illustrated for the Read operation in FIG. 2. Two cases are shown. In case 1 (FIG. 2C) the Word-Line pulse has a greater delay than SA enable. The limit at which the timing relationship is still maintained is shown occurring at Block M (FIG. 2B). In subsequent memory blocks the skew exceeds the required timing criteria resulting in operational failure, as illustrated for Block N. In case 2 (FIG. 2D and FIG. 2E) an analogous situation occurs affecting the trailing edge timing relationships. FIG. 3 illustrates similar situations for the memory Write operation.

Four known U.S. patents deal with multi-block systems involving either global interconnection or local generation of control signals.

U.S. Pat. No. 5,837,557 (Fulford, Jr. et al) describes a semiconductor structure consisting of multiple circuit blocks which are globally interconnected by means of a blanket metal layer. The structure described in the patent allows a reduction of overall circuit size, enhanced circuit quality and improvements in fabrication time and costs.

U.S. Pat. No. 5,581,126 (Moench) deals with the layout of interconnect lines within integrated circuits. It is the object of the invention to eliminate data pattern sensitivity and unwanted differential signals in SRAM arrays due to lateral capacitive coupling from adjacent lines. This is accomplished by using a crossover structure to reduce the effect of parasitic capacitance.

U.S. Pat. No. 5,243,703 (Farmwald et al) describes a method for generating a synchronized clock pulse at each device block in a computer memory system consisting of multiple blocks. This is done with a single globally generated clock pulse that is transmitted to each of the blocks via a looped path. Each block receives one input from the forward half of the loop and another input from the return half of the loop. This allows each block to generate a clock pulse with synchronized timing. The patent does not address the problem of control pulse skew as described by the present invention.

U.S. Pat. No. 4,926,384 (Roy) deals with SRAM write cycle recovery timing. The patent describes an SRAM composed of multiple separate memory blocks where each block has its own local bit line equalization circuitry. This removes the process of equalizing the bit lines after a write cycle from the critical timing path for accessing the memory. The patent also provides means for automatically equalizing the common data out lines at the end of each memory access cycle which removes the process of equalizing the common data out lines from the critical timing path for accessing the memory.

SUMMARY OF THE INVENTION

It is the object of this invention to reduce the timing skew between memory control pulses in multi-block semiconductor memory systems.

Another object of the present invention is to use the reduced timing skews between memory control pulses to achieve faster memory cycle times.

Another object of the present invention is to use the reduced timing skews between memory control pulses to increase SRAM operational reliability.

A further object of the present invention is to use the reduced timing skews between memory control pulses to increase the SRAM chip yield.

These objects have been achieved by generating memory control pulses locally in each memory block. A single global pulse, distributed to each memory block, initiates the generation of local memory control pulses.

BRIEF DESCRIPTION OF THE DRAWINGS

FIG. 1 shows a block diagram of a conventional multi-block SRAM with centrally generated and globally distributed memory control pulses.

DESCRIPTION OF THE PREFERRED EMBODIMENT

Figure 2A:
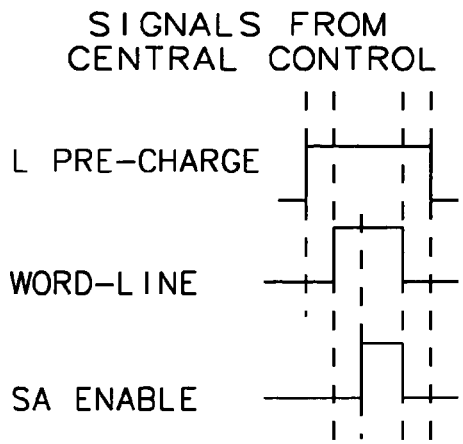
FIG. 2 (FIG. 2A, FIG. 2B, FIG. 2C, FIG. 2D, FIG. 2E) shows the effect of skew on timing relationship during a SRAM Read operation FIG. 3 (FIG. 3A, FIG. 3B, FIG. 3C, FIG. 3D, FIG. 3E) shows the effect of skew on timing relationship during a SRAM Write operation
Figure 2B:
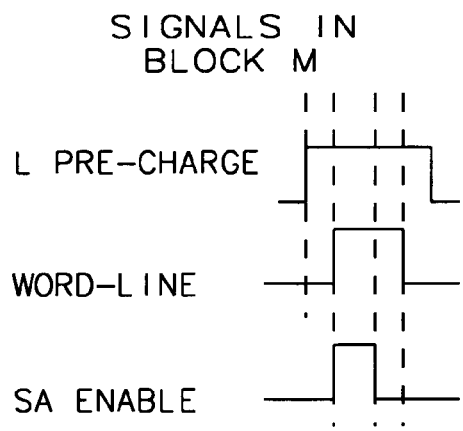
Figure 2C:
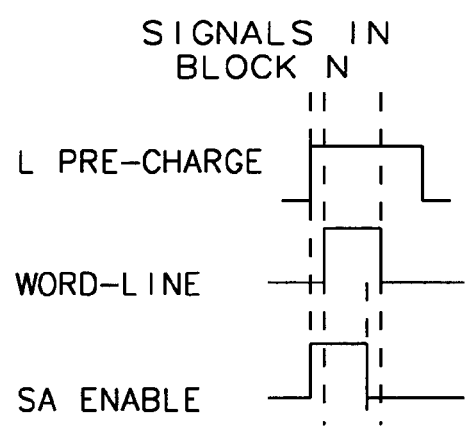
Figure 2D:
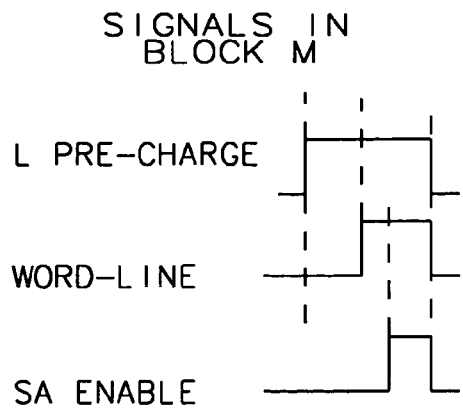
Figure 2E:
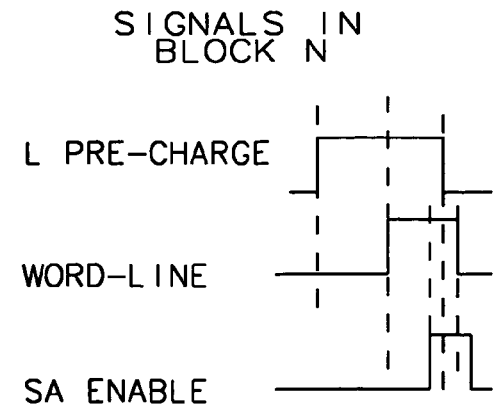
Figure 3A:
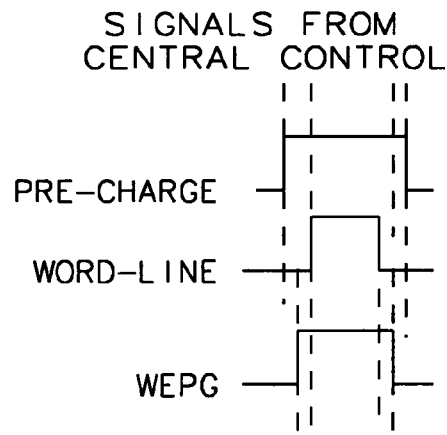
Figure 3B:
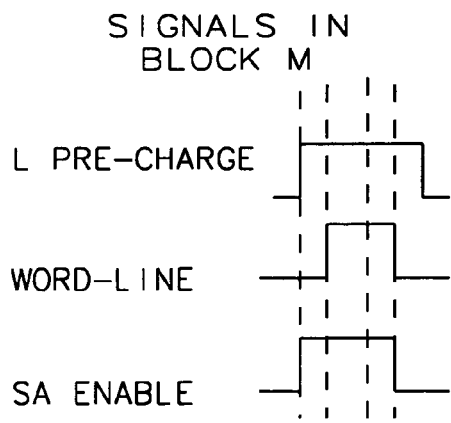
Figure 3C:
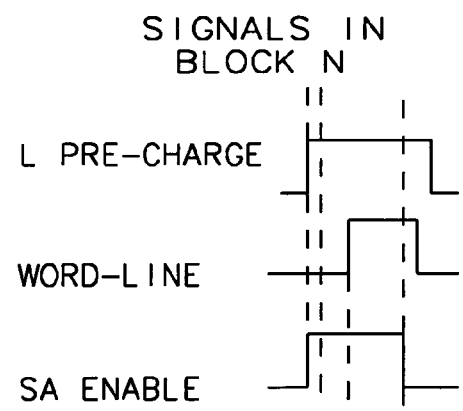
Figure 3D:
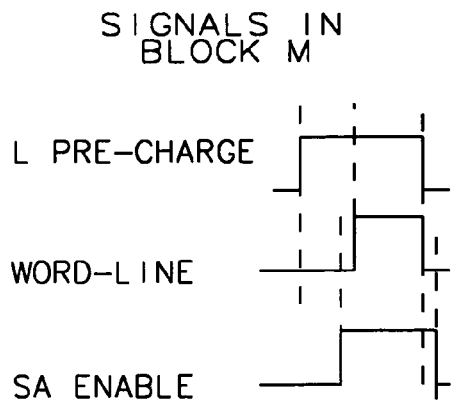
Figure 3E:
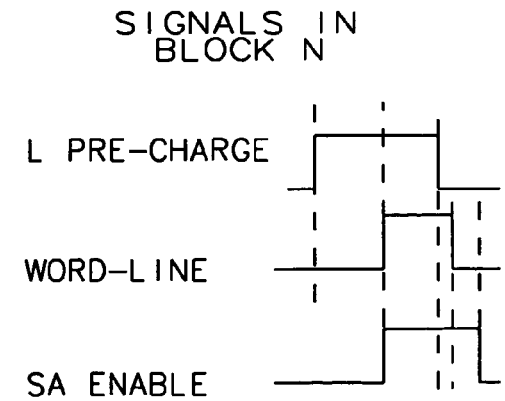
Figure 4:
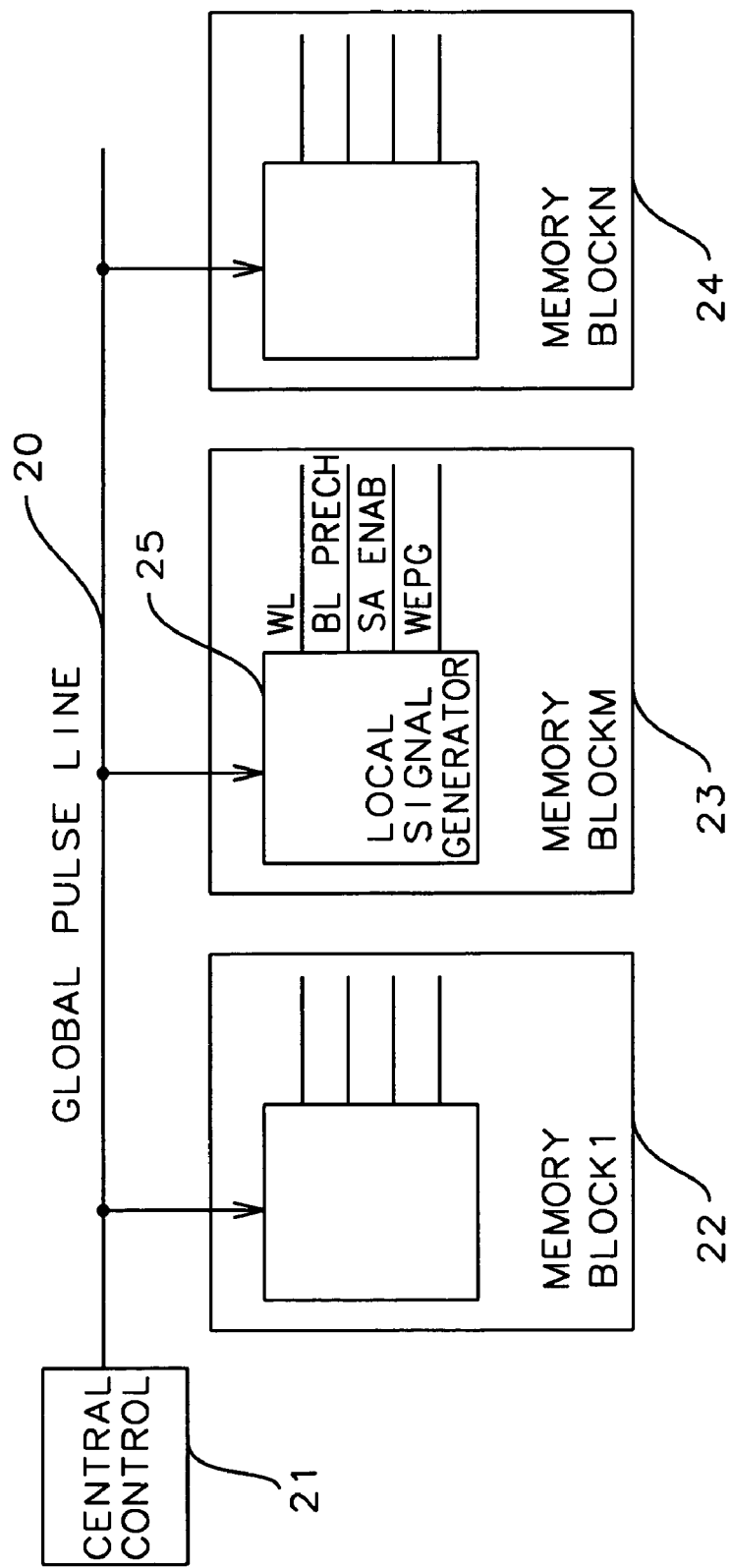
FIG. 4 shows a high level block diagram of multi-block SRAM using a single global pulse with locally generated memory control pulses.

Referring now to FIG. 4, it shows a block diagram illustrating the principal components, according to the preferred embodiment of the invention, consisting of central control and a multiplicity of SRAM memory blocks. The Central Control 21 generates a single Global Pulse which is distributed to each of the memory blocks via Global Pulse Line 20. Each of the SRAM memory blocks 22, 23 and 24 in the system are identical. Each memory block contains an identical local signal generator which responds to the single global pulse and generates the required memory control pulses. Thus, SRAM memory block 23 (M) contains the local signal generator (Loc.Sig.Gen.) 25 which generates the four memory control pulses which are required for the various memory operations. These are: Word Line pulse (WL), Bit-line Pre-charge pulse (BL Prech.), Sense Amplifier Enable (SA Enab.) and Write Enable Pass Gate (WEPG).

Figure 5:
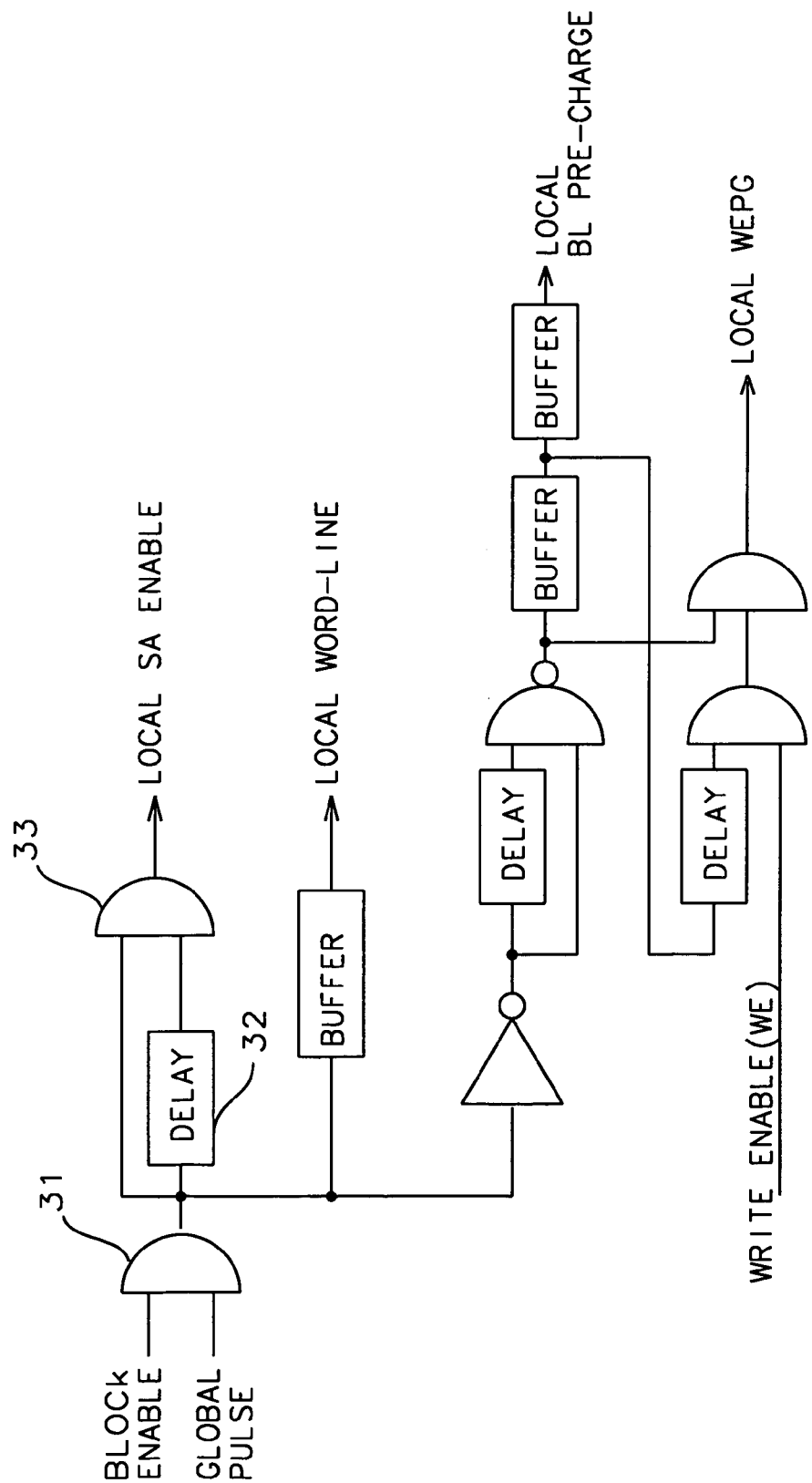
FIG. 5 shows a high level block diagram of a local memory control pulse generator.

FIG. 5 shows a block diagram of a local signal generator. A similar local signal generator is contained at each memory block. The function of the local signal generator is to generate all the needed local pulse signals for the read and write memory cycles with the correct relationship between the leading and trailing edges of the memory control pulses. These relationships are controlled by means of delay elements as shown in FIG. 5. For example, the circuit comprised of Gate 31, Delay Element 32, and Gate 33 generates the SA Enable control pulse with a leading edge delayed from the leading edge of the Global Pulse and a trailing edge aligned with the trailing edge of the Global Pulse. All local control pulses are enabled by the local Block Enable level. Similarly, in FIG. 5, the other control pulses are generated with the required leading and trailing relationships by means of appropriate delay elements. This technique for generating pulse relationships is well known to those skilled in the art.

The advantages of the present invention are:

it eliminates the skew between memory control pulses that occurs in systems with centrally generated and globally distributed memory control pulses;

Improvement in memory cycle time by reducing the required timing margins;

Improved operational reliability by maintaining proper memory control pulse relationships without increased timing margins;

chip manufacturing process variations have reduced impact on skew thereby improving chip yield.

What is claimed is:

1. A semiconductor memory system with skew-free local signals comprised of:
   a central control block which generates a single global pulse for said memory system, where said single global pulse is distributed to and used by memory control pulse generators;
   one or more memory blocks which store data and execute Read and Write operations;
   one or more of said generators of memory control pulses generating the correct relationship between the leading and trailing edges of said memory control pulses required for execution of memory Read and Write operations.

2. The semiconductor memory system of claim 1 where said generators of memory Read and Write control pulses are local to each of said memory blocks.

3. An SRAM system with skew-free local signals comprised of:
   one or more SRAM blocks which store data and execute Read and Write operations;
   a central control block which provides a single global pulse distributed to each of said SRAM blocks;
   a generator of memory Read and Write control pulses in each of said SRAM blocks, where said control pulses are generated from said single global pulse.

4. A generator of said memory Read and Write control pulses in claim 3 wherein:
   said generator is local to each of said SRAM blocks;
   said generator produces a multiplicity of required memory control pulses in each of said SRAM blocks.

5. The SRAM system of claim 3 where the generator of memory control pulses is local to each of said SRAM blocks and is comprised of logic circuits and delay elements where said single input global pulse is used to initiate all the memory control pulses for both the Read and Write operations; the required timing relationships of said memory control pulses are generated with smaller timing margins than is required for systems with global distribution of memory control pulses.

6. A semiconductor memory system with skew-free local signals comprised of:
   a means for centrally generating a single global pulse for said memory system;
   a means for storing data and executing Read and Write operations in one or more memory blocks;
   a means for generating memory control pulses with the correct relationship between the leading and trailing edges of said memory control pulses required for execution of memory Read and Write operations, where said memory control pulses are generated from said single global pulse.

7. The semiconductor memory system of claim 6 where said means for generating memory Read and Write control pulses is local to each of said memory blocks.

8. The semiconductor memory system of claim 7 having means for distributing said single global pulse of claim 6 to said means for generating memory control pulses.

9. An SRAM system with skew-free local signals comprised of:
   a means for storing data and executing Read and Write operations in one or more SRAM blocks;
   a means for centrally generating a single global pulse and distributing said global pulse to each of said SRAM blocks:
   a means for generating memory control pulses required for execution of memory Read and Write operations in each SRAM block, where said memory control pulses are generated from said single global pulse.

10. The SRAM system of claim 9 having a means for generating the required memory control pulses with reduced margins in each SRAM block.

11. The SRAM system of claim 9 having means for generating memory control pulses locally in each of said SRAM blocks and having logic and delay means for generating all the memory control pulses for both the Read and Write operations with smaller timing margins than required for systems with global distribution of memory control pulses.

* * * * *